United States Patent
Pangrle et al.

(10) Patent No.: US 6,171,947 B1
(45) Date of Patent: Jan. 9, 2001

(54) METHOD OF REDUCING INCIDENCE OF STRESS-INDUCED VOIDING IN SEMICONDUCTOR INTERCONNECT LINES

(75) Inventors: Suzette K. Pangrle, Cupertino; Paul R. Besser, Sunnyvale; Minh Van Ngo, Union City; Stephan Keetai Park, Cupertino; Susan Tovar, Gilroy, all of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 09/209,367

(22) Filed: Dec. 8, 1998

(51) Int. Cl.[7] .................................................. H01L 21/31
(52) U.S. Cl. ........................ 438/624; 438/674; 438/763; 438/769; 438/786; 438/771
(58) Field of Search .................................. 438/622, 624, 438/625, 627, 634, 636, 761, 763, 769, 770, 786

(56) References Cited

U.S. PATENT DOCUMENTS

| | | | |
|---|---|---|---|
| 4,717,631 | * 1/1988 | Kaganowicz et al. | 148/33.3 |
| 5,260,236 | * 11/1993 | Petro et al. | 438/786 |
| 5,466,617 | * 11/1995 | Shannon | 438/155 |
| 5,710,067 | * 1/1998 | Foote et al. | 438/636 |
| 5,930,627 | * 7/1999 | Zhou et al. | 438/257 |
| 5,989,957 | * 11/1999 | Ngo et al. | 438/257 |
| 6,004,632 | * 12/1999 | Hsu et al. | 427/579 |

OTHER PUBLICATIONS

Besser, Marieb, Lee, Flinn & Bravman, Journal of Materials Research, vol. 11, No. 1, Jan. 1996, p. 184 (10 pgs).
Besser, Brennan & Bravman, Journal of Materials Research, vol. 9, No. 1, Jan. 1994, p. 13, (12 pages).
Flinn, Mack, Besser & Marieb, MRS Bulletin, Dec. 1993, p. 26 (10 pages).
Besser, Mack, Fraser, Bravman, Journal of Electrochemical Society, vol. 140, No. 6, Jun. 1993, p. 1769, (4 pages).

* cited by examiner

Primary Examiner—Mary Wilczewski
Assistant Examiner—Yung A. Lin
(74) Attorney, Agent, or Firm—LaRiviere, Grubman & Payne, LLP

(57) ABSTRACT

In a method for forming an interlayer dielectric (ILD) coating on microcircuit interconnect lines of a substrate, the substrate and interconnect lines are annealed prior to deposition of an ILD. A post annealing SiON layer is formed by using plasma-enhanced chemical vapor deposition. The deposition using a plasma formed of nitrogen, nitrous oxide, and silane gases, with the gases being dispensed at regulated flow rates and being energized by a radio frequency power source. The plasma reacts to form SiON which is deposited on a semiconductor substrate. Additionally, during deposition, minor adjustments are made to deposition temperature and process pressure to control the optical characteristics of the SiON layer. The SiON layer is tested for acceptable optical properties and acceptable SiON layers are coated with a $SiO_2$ layer to complete formation of the ILD. Once the ILD is formed the substrate is in readiness for further processing. The pre-ILD annealing results in a substantially reduced incidence of stress-induced voiding in the underlying interconnect lines. Furthermore, the pre-ILD annealing can be combined with other advantageous process environments to more significantly reduce the incidence of stress-induced voiding in the underlying interconnect lines. Such combinations include process temperature reduction to below about 380 degrees Celsius and reduction of silane flow rate to less than about sixty standard cubic centimeters per minute.

11 Claims, 7 Drawing Sheets

METHOD OF REDUCING INCIDENCE OF STRESS-INDUCED VOIDING IN SEMICONDUCTOR INTERCONNECT LINES

RELATED APPLICATIONS

Two other Patent Applications are copending and concurrently filed on Dec. 8, 1998. The Applications are identified under LaRiviere, Grubman, & Payne, LLP identification numbers: P873 and P874. Both Applications are entitled "Method of Reducing Incidence of Stress-Induced Voiding in Semiconductor Interconnect Lines" and are incorporated herein, in their entirety, by reference.

TECHNICAL FIELD

The present invention relates, generally, to semiconductor fabrication, and more particularly to methods for forming improved inter-layer dielectric (ILD) coatings for semiconductor substrates having small gaps between electrically conducting interconnect lines.

BACKGROUND

Semiconductor microchips find use in a wide variety of applications, including hand-held computing devices, wireless telephones, desktop computers, and digital cameras, etc. These microchips are generally comprised of logic and memory devices. It is important and desirable that each semiconductor microchip contain as many logic or memory devices as possible per unit area. This effectively reduces the size, weight, and energy consumption of devices formed on the wafers. At the same time, the memory capacity and computing power of the devices is improved.

As stated above, semiconductor devices are divided into two very broad categories, logic devices and memory devices. The present invention is applicable to either of these general categories. The microcircuit structures formed in present art fabrication processes are electrically interconnected by conductive elements referred to as "interconnect lines". Typical interconnect lines are formed by the deposition of one or more electrically conductive layers (also commonly known as metallization layers) on a substrate followed by lithographic masking according to a predetermined pattern and etching to transfer the lithographic pattern onto the conducting layers. These etched patterns form interconnect lines which may be arranged in multi-level structures through repeated process steps. After etching, the interconnect lines are electrically isolated from each other by depositing dielectric material in the open spaces separating the interconnect lines as well as between the various vertical layers of multi-layer structures. The process of electrically isolating these interconnects is known as forming an inter-layer dielectric (ILD).

With the increasing circuit density of modern integrated circuits came the need for increasing interconnect density. Interconnect lines became thinner and more closely spaced in order to accommodate the need of increasing circuit density. Keeping this in mind, the so called 0.25 $\mu$m technology was developed. In 0.25 $\mu$m technology, the transistor gates are approximately 0.25 $\mu$m wide and the spacing between interconnect lines is generally less than about 0.35 $\mu$m. At the same time, the interconnect lines have heights in the range of about 0.7 $\mu$m to about 1.1 $\mu$m. These small sizes result in advantageous increases in circuit density. However, the small size of 0.25 $\mu$m technology makes the formation of a reliable ILD layers difficult.

Typical interconnect lines are formed on top of a substrate using a "stack" of more than one material. Such stacks are typically formed of several layers, for example, an aluminum or aluminum alloy layer and one or more other layers. A typical stack may have a thin titanium (Ti) layer, followed by the deposition of a thin aluminum (Al) layer, which is then capped with a thin titanium nitride (TiN) layer. Although the foregoing example uses a three layer TiN/Al/Ti stack, stacks may be formed using more (or fewer) layers and many different combinations of materials. The specific materials chosen are selected by process engineers to meet preset specifications. These metallization layers are lithographically patterned and chemically etched to form the desired pattern for the interconnect lines. In accordance with current technology, the gaps between the adjacent metal stacks are filled with an electrically insulating material to form an ILD. Commonly employed methods, as believed by Applicants use high density plasma (HDP) deposition or plasma-enhanced chemical vapor deposition at temperatures in excess of 400° C. Unfortunately, these high process temperatures cause some significant problems.

As linewidths and feature sizes have decreased and interconnect density has increased over the past ten years, a phenomenon known as "stress-induced voiding" or "cavitation" has become common. Voids in interconnect lines degrade microcircuit performance, eventually leading to microcircuit failure. In the recent past, metal interconnect linewidths were relatively large, as a result, the occurrence of stress-induced voiding was infrequent. However, as interconnect linewidth has decreased, the incidence and magnitude of stress-induced voiding has become significant.

The problem of stress-induced voiding has its roots in the differing rates of thermal expansion existing between interconnect materials, the substrate materials, and ILD materials. The thermal expansion coefficients of conducting materials may be five times or more as great as the thermal expansion coefficients of the silicon and ILD materials which encase them. The conducting material expands and contracts at a different rate than the surrounding semiconductor and dielectric materials. This becomes a problem during the heating and cooling cycles of semiconductor fabrication processes. A more complete description of these problems and their drastic effect on interconnect lines is set forth in "Stress-Induced Void Formation in Metal Lines", M.R.S. Bulletin, December 1993, by Paul A. Flinn, Anne Sauter Mack, Paul R. Besser, and Thomas N. Marieb, the text of which is hereby incorporated, in its entirety, by reference.

During heating and cooling, the stack materials expand and contract at a greater rate than either the silicon or the dielectric layers which confine them. This causes stress in the interconnect lines. Once the stress becomes too great, the interconnect material plastically deforms in order to relieve the stress. This level of stress is known as the yield stress of the material. Generally speaking, when a material is subject to stress in one or two directions it deforms and undergoes plastic flow in the unstressed directions to relieve the stress. However, when confined by relatively rigid structures, as is the case when interconnect lines are surrounded by the substrate and an ILD layer, the interconnect can not plastically flow. In microcircuit interconnects, this may result in voiding. The effects of voiding in interconnect lines are compounded by an effect known as "void electromigration" which causes the voids to move and aggregate causing circuit failure. These effects may be intensified by process conditions which lead to embrittlement of the interconnect materials, making them more vulnerable to the voiding phenomena.

For the forgoing reasons there is a need for ILD fabrication methods and structures which reduce embrittlement of interconnect lines and reduce the incidence of stress-induced voiding in interconnect lines.

BRIEF DESCRIPTION OF THE DRAWINGS

For a fuller understanding of the present invention, reference is made to the accompanying drawings in the following detailed description of the invention. In the drawings.

Reference numbers refer to the same or equivalent parts of the present invention throughout the several figures of the drawings.

DETAILED DESCRIPTION OF THE INVENTION

The present invention is a method of forming an improved ILD layer which minimizes void formation in an underlying interconnect line. The advantages of the present invention are more clearly illustrated by describing the methods currently used to form ILD's.

Figure 1:
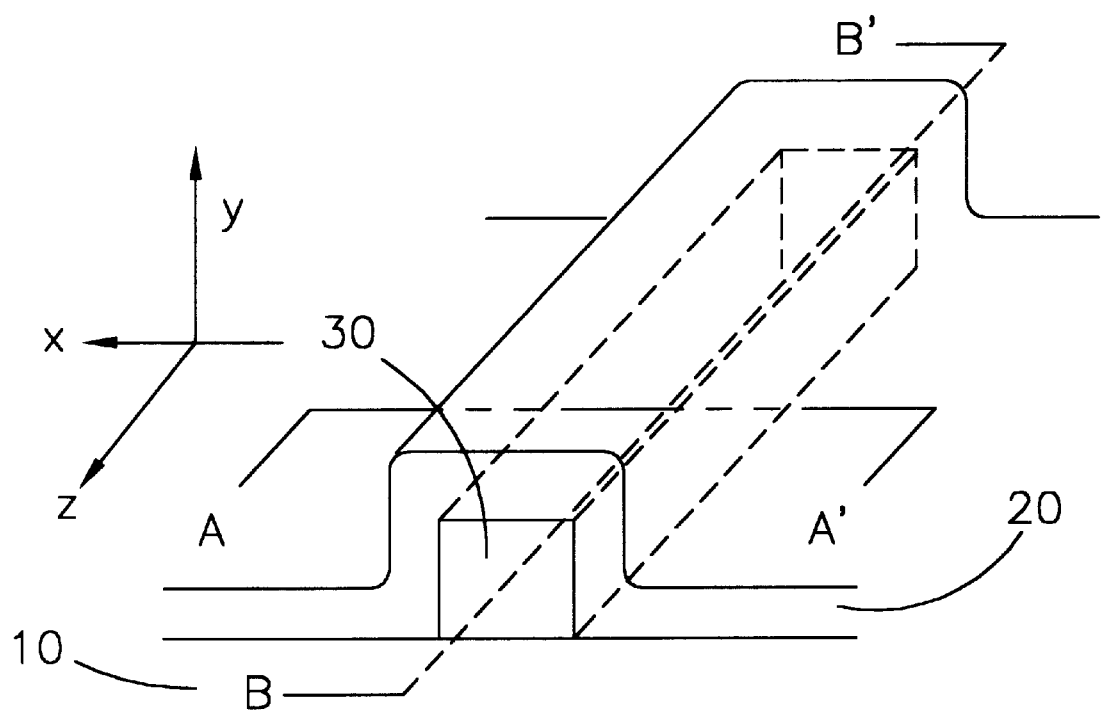
FIG. 1 is a perspective view of a portion of a semiconductor surface, showing an interconnect line hidden under an ILD layer.
Figure 2:
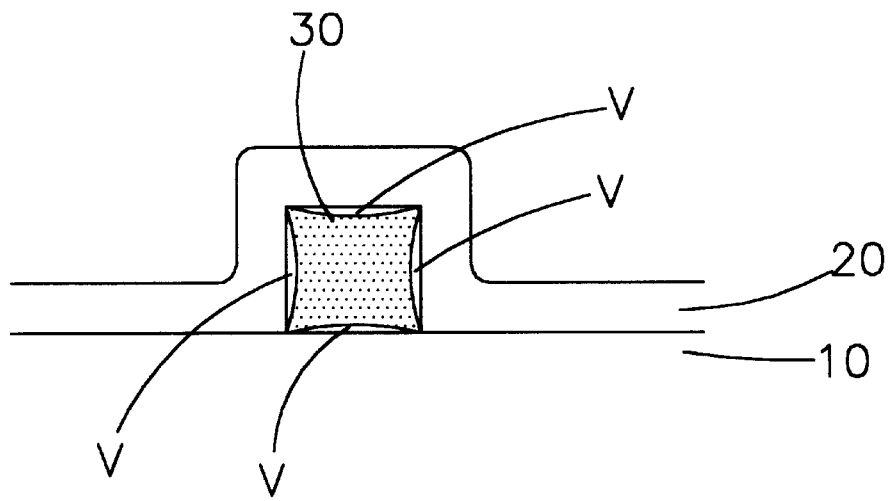
FIG. 2 is a section view of FIG. 1 along axis A–A' after the interconnect and ILD layer have cooled from ILD deposition temperatures.

As shown in FIG. 1, current process methods completely encase interconnect lines 30 (also referred to as "stacks") between the ILD 20 (constructed of $SiO_2$, for example) and the substrate 10. Commonly, an ILD 20 is formed using PVD or PECVD techniques using temperatures in excess of 400° C. Since the entire structure (substrate 10, ILD 20, and interconnect line 30) is heated during deposition of the ILD 20, the entire structure is subject to post-deposition cooling. Due to differing thermal expansion coefficients, the interconnect line 30 (formed of, for example, Al) contracts at a greater rate than the surrounding ILD 20 and substrate 10. This subjects the interconnect line 30 to a great deal of stress. The surrounding ILD 20 and substrate 10 constrain the interconnect line 30 preventing it from plastically deforming to relieve stress. To relieve this stress, small voids V form in the interconnect lines 30 as shown in FIG. 2 which illustrates a cross section view along axis A–A' of FIG. 1.

Figure 3:
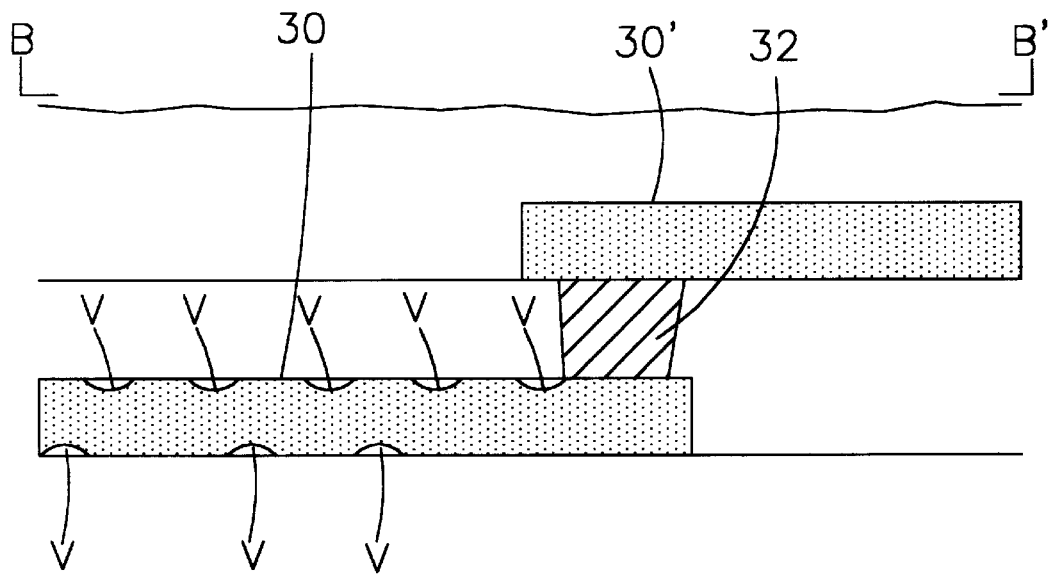
FIG. 3 shows a section view, as along axis B–B' of FIG. 1, of a portion of a multilayer semiconductor interconnect structure with voids.
Figure 4:
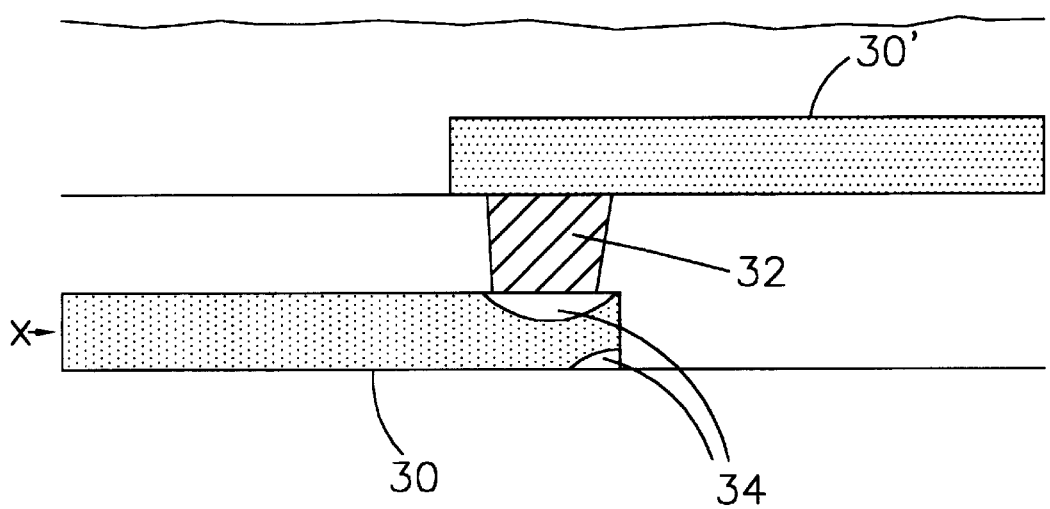
FIG. 4 shows a section view similar to that shown in FIG. 3 after the voids have electromigrated.

Referring to FIGS. 3 and 4, which are section views, as along axis B–B' of FIG. 1, small voids V can form throughout the length of a metal interconnect line 30 and are subject to a phenomenon known as void electromigration. FIG. 3 depicts a multi-level microcircuit structure with two interconnect lines 30, 30' located in different layers electrically joined through a via by a metal plug 32 (typically formed of tungsten). FIG. 3 shows the effect of stress-induced voiding. Voids V may be induced throughout the length of the interconnect line 30. During use, current passes through the interconnect lines 30, 30'. Over time, the voids V move (or migrate) and aggregate. As shown in FIG. 4, the voids have migrated in direction X, and have aggregated into larger voids 34. When the larger voids 34 migrate to a position underneath a metallization plug 32, as shown in FIG. 4, the interconnect lines 30, 30' become highly resistive and/or electrically disconnected. This leads to circuit failure and is highly undesirable.

It has been discovered that current process temperatures lead to an excessive incidence of stress-induced voiding. Also, it has been discovered that when silane is used as a reactant gas, a phenomenon known as hydrogen embrittlement occurs in the metal interconnect materials. It has been discovered that interconnect lines containing aluminum or copper are particularly vulnerable to the embrittlement effect. Embrittlement worsens the stress-induced voiding problem.

It has also been discovered that annealing affects voiding. In interconnect lines 30 having Al and Ti layers in contact with each other, a $TiAl_3$ compound is formed during annealing. The process of forming $TiAl_3$ is accompanied by a volume contraction which induces stress in the interconnect material. This stress is magnified by the presence of an encasing layer of ILD 20 during annealing, which rigidly constrains the interconnect line 30 preventing plastic deformation, thereby contributing to void formation.

IMPROVED METHOD OF ILD FORMATION USING REDUCED PROCESS TEMPERATURES

Figure 5:
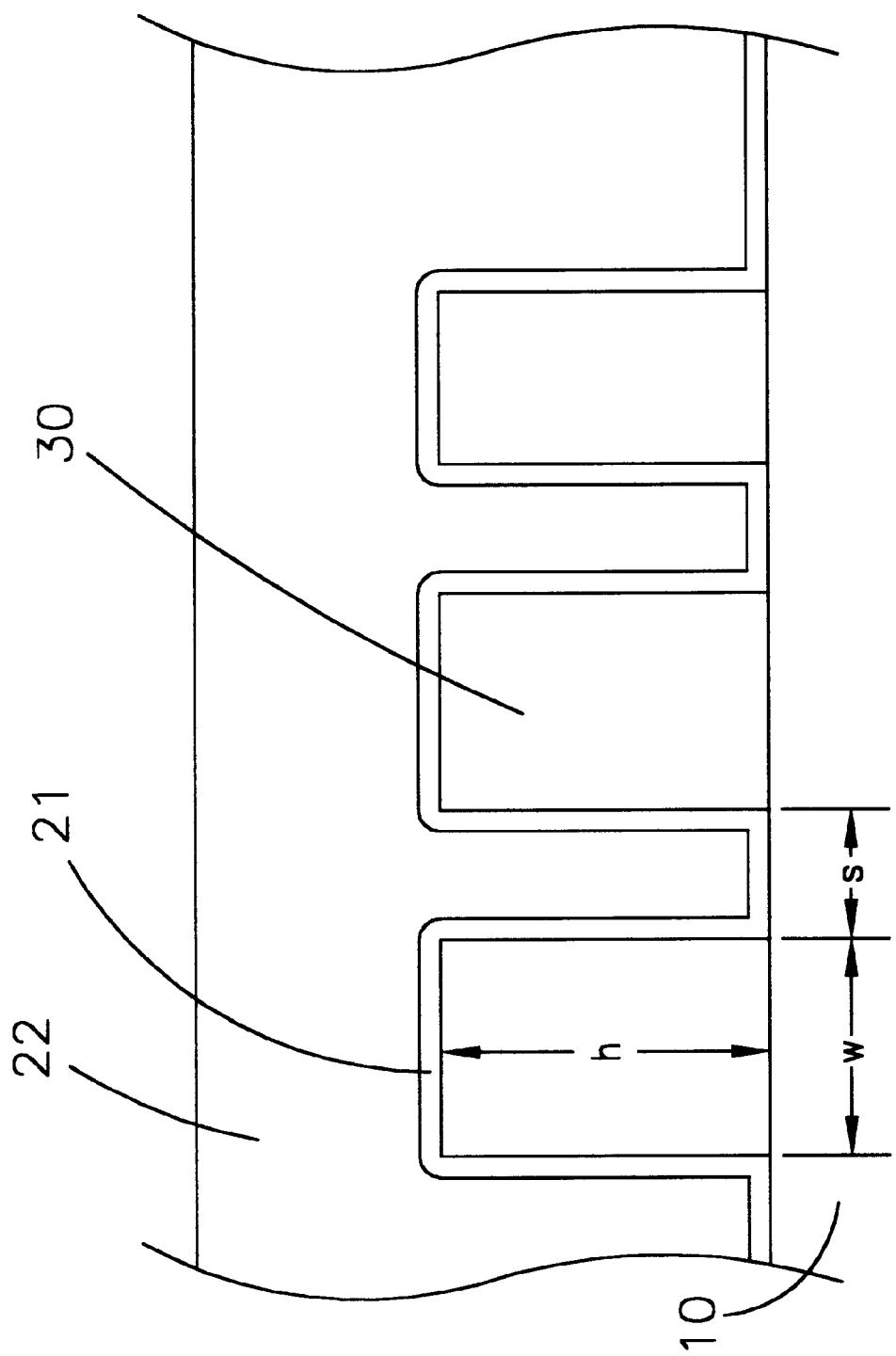
FIG. 5 is a section view of a semiconductor substrate after ILD formation using the present invention.

In accordance with the principles of the present invention, there are provided methods of reliably, rapidly, and effectively forming an ILD 20 which significantly reduces or eliminates the incidence of stress-induced voiding in interconnect lines 30, thereby improving 0.25 µm chip reliability. In the process of the present invention, interconnect lines 30 are patterned, etched, and formed on a semiconductor substrate 10. As shown in FIG. 5, typical interconnect lines 30 or "stacks" have a height, h, in the range of about 0.7–1.1 µm and a width, w, in the range of about 0.4–0.5 µm. The spacing, s, is typically about 0.3 µm. In accordance with the principles of the present invention, the ILD 20 is comprised of two materials. First, a SiON layer 21 is deposited by one of the PECVD techniques disclosed herein. The SiON layer 21 is tested for acceptable optical properties. If the SiON layer 21 is acceptable, then a $SiO_2$ layer 22 is formed over the SiON layer 21. The $SiO_2$ layer 22 may be planarized using chemical mechanical polishing (CMP) or subject to other further processing.

In one form of the present invention, there is formed a SiON layer 21 by using a PECVD machine at a reduced process temperature. By reducing process temperatures the stress on the interconnect lines 30 is minimized during cooling. This advantageously reduces the incidence of stress induced voiding in the interconnect lines 30.

Figure 6:
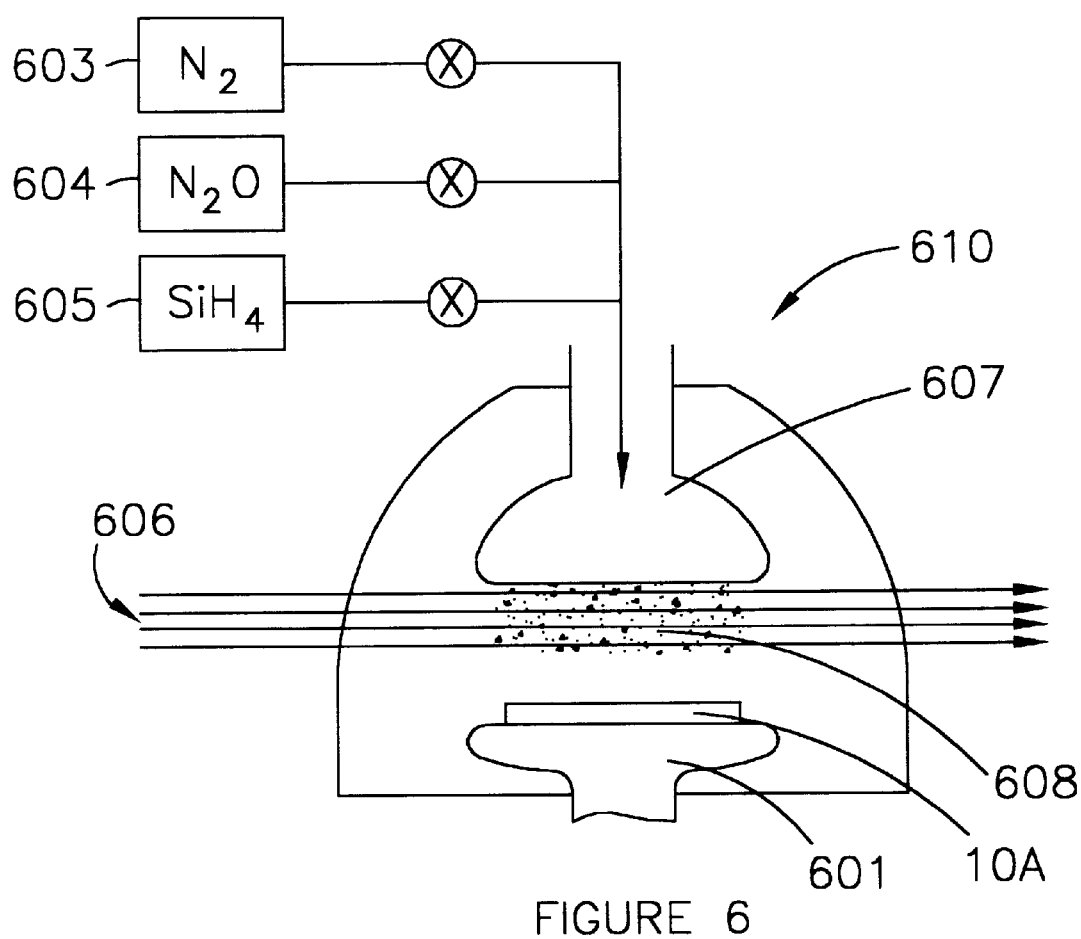
FIGS. 6 and 7 are cross-section views of a typical PECVD chamber depicting the process of the present invention.
Figure 8:
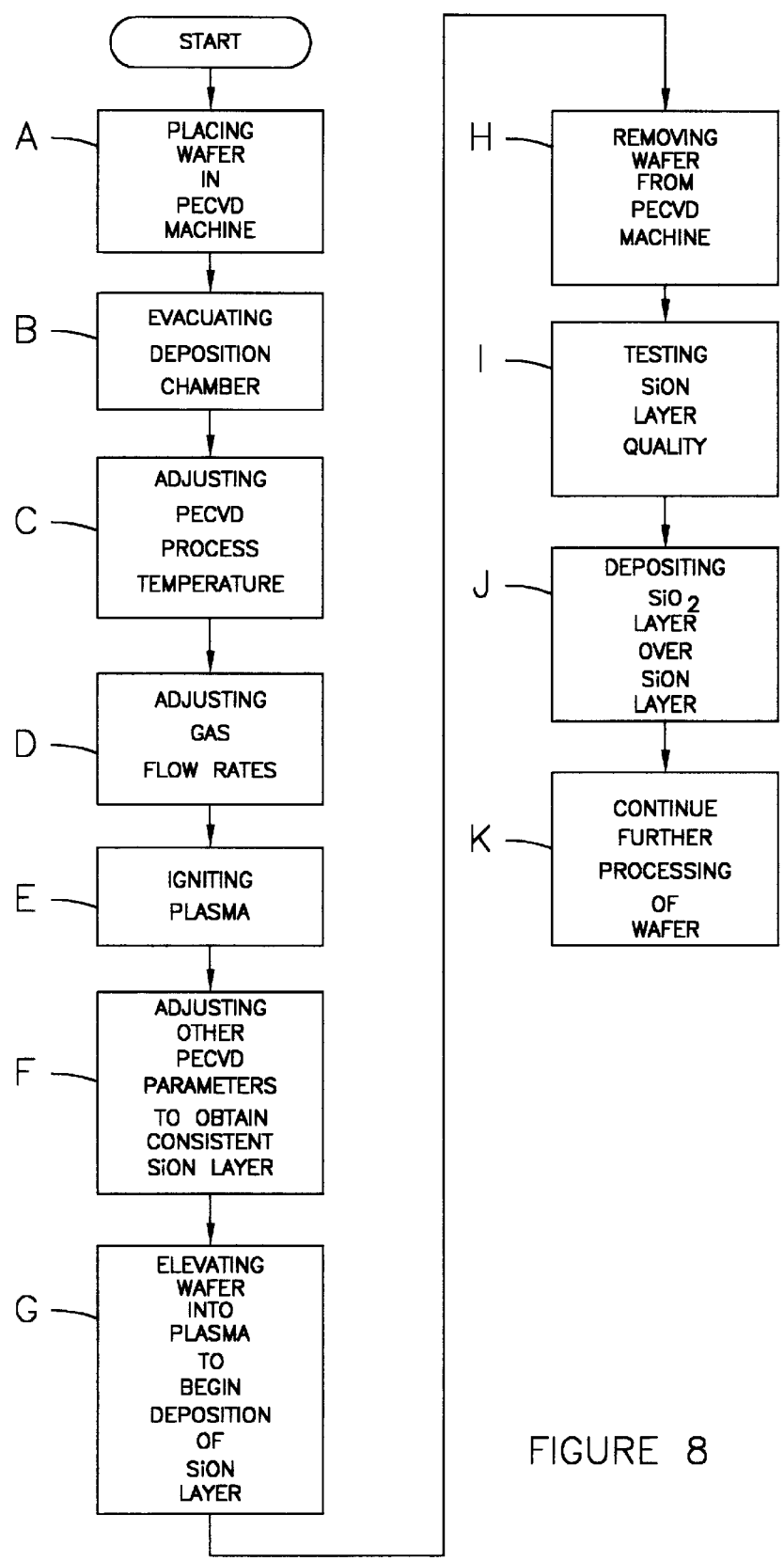
FIGS. 8 and 9 are flow charts depicting the process flows of the present invention.

Referring to FIGS. 5, 6, and 8, a typical PECVD tool is used in the present invention. Such tools are provided by numerous manufacturers, such as, Applied Materials of Santa Clara, Calif. or Novellus of San Jose, Calif. An acceptable machine is an Applied Materials P5000. FIG. 6 depicts a PECVD chamber 610 in preparation for the deposition of a SiON layer 21. As shown in Step A of FIG. 8, a wafer 10A is placed on a susceptor 601 of a PECVD chamber 610. In Step B, a vacuum is created inside the chamber 610. Typical levels of vacuum are between $10^{-6}$ to $10^{-9}$ Torr. In Step C the temperature of the susceptor 601 is adjusted to regulate the process temperature. In the invention process, temperatures of less than about 380° C. are used. In Step D, $N_2$, $N_2O$, and $SiH_4$ gases (603, 604, and 605, respectively) are then allowed to flow into the chamber 610 at regulated flow rates. Typical flow rates for the reaction gases are in the range of about 1700–2300 SCCM for $N_2$ 603, 60–70 SCCM for $SiH_4$ 605, and about 60–70 SCCM for $N_2O$ 604. In Step E, before the gases contact the wafer 10A they are subject to a radio frequency (RF) AC power source 606. The power source 606 is a standard 13.56 or 30 MHz power source. The power used is generally between about 285–330 Watts (W). The power source 606 introduces RF electromagnetic energy into the reaction gases 603, 604, and 605, igniting a plasma. This energized plasma forms a region above the wafer 10A and susceptor 601 where it forms a plasma cloud 608. SiON forms in the plasma cloud 608.

Figure 7:
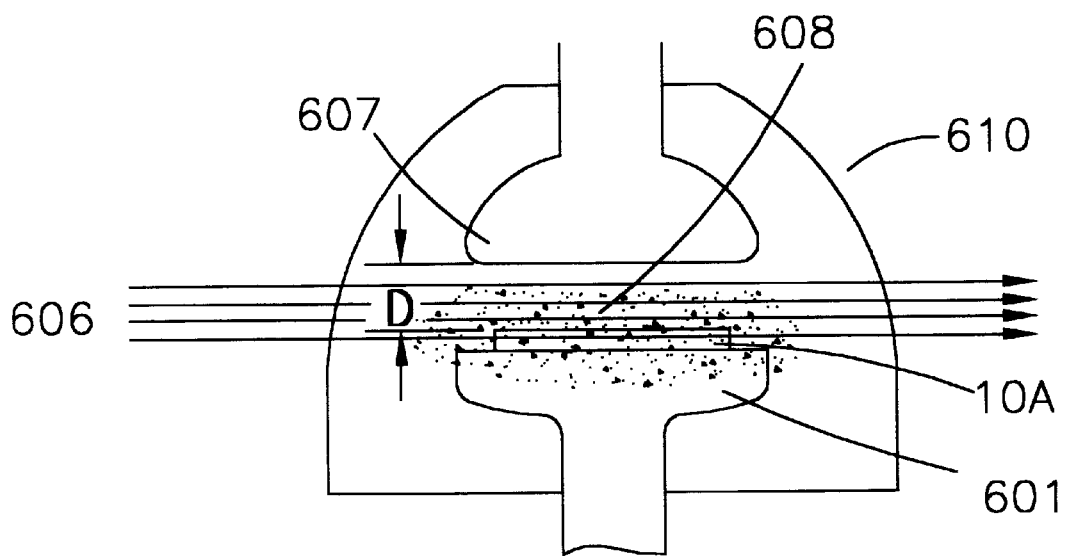

Referring to FIG. 7 and Step F of FIG. 8, once the plasma cloud 608 is formed, the PECVD deposition parameters are adjusted to insure the SiON layer 21 maintains consistent optical properties. Typically, this is accomplished by adjusting deposition parameters such as process temperature or process pressure. The details of such adjustments are disclosed below. In Step G, the susceptor 601 is elevated, raising the wafer 10A into the plasma cloud 608 where deposition of SiON begins. Typically, the distance, D, between the wafer 10A and the electrode 607 is about 425 mils. This distance may be adjusted to alter SiON layer coverage. Unlike previous ILD processes, where SiON deposition is conducted at temperatures above 400° C., the present invention relies on SiON deposition performed at temperatures in the range of about 350–380° C., preferably at about 350° C. During deposition the chamber pressure is maintained in the range of about 2.5–6.0 Torr. The SiON layer 21 is deposited to a thickness ranging from about 250 Å to about 3000 Å with a preferred thickness of approximately 2000 ÅA. Under these conditions, deposition for approximately 30–40 seconds results in an acceptable SiON layer 21. As a result of the lower temperature process, the interconnect line stress is less than that found in previously used process techniques. This reduced interconnect stress advantageously lessens the incidence of stress induced voiding. In Step H the wafer 10A is removed from the chamber 610. Subsequently, in Step I the SiON layer 21 is tested for optical properties. It is known that there is good correlation between SiON layer 21 optical characteristics and SiON layers of acceptable chemical composition, density, and thickness uniformity. Various tools, such as reflectometers, ellipsometers, and ultraviolet spectrometers can be used to determine the optical characteristics of the SiON layer. An acceptable tool is an Optiprobe machine manufactured by Thermalife of Fremont, Calif. which contains a reflectometer, ellipsometer, and an ultraviolet spectrometer. Typical parameters used to determine if a SiON layer 21 is acceptable are absorption coefficient or refractive index. For example, using a 673 nm exposure source, a refractive index in the range of 1.63–1.71 is acceptable. Additionally, X-ray diffraction techniques may be used to determine if the stress level in the interconnect is acceptable.

If the refractive index is not within acceptable parameters, the pressure and plasma-energizing power of the process may be adjusted until the optical properties of the SiON layer 21 is within acceptable parameters. For example, when using an Applied Materials P5000, by decreasing either chamber pressure or RF power, the refractive index of the SiON layer 21 may be lowered. Conversely, by increasing either chamber pressure or RF power, the refractive index of the SiON layer 21 may be raised. It should be noted that these adjustments may vary on other types of PECVD machines. Once an acceptable SiON layer 21 has been formed over an interconnect line 30 the same SiON deposition conditions can be used for additional wafers. Due to the high degree of repeatability characteristic of most modern PECVD machines, the same process conditions may be used to establish nearly identical SiON layers 21 on a series of wafers 10A. During processing of a series of wafers 10A continued reliability and consistency, is insured by periodic wafer checks (i.e., a wafer 10A is removed and checked every 20 to 25 wafers).

Once a reliable SiON layer 21 has been formed. In Step J, a relatively thick layer of $SiO_2$ 22 may be formed over the SiON layer 21 to complete the formation of an improved ILD. The $SiO_2$ layer 22 may be applied thickly if subsequent CMP is desired. Alternatively, a thinner $SiO_2$ layer 22 may be used if subsequent via etching is desired. A typical thickness range for such $SiO_2$ layers 22 is between about 0.5 $\mu$m to about 1.5 $\mu$m. The precise thickness being determined by the process engineer. The wafer 10A is now ready for further processing as shown in Step K. Such processing may include CMP or vertical integration.

IMPROVED METHOD OF ILD FORMATION USING REDUCED SILANE GAS FLOW RATE

It has been shown that the presence of hydrogen (H) radicals during ILD formation leads to embrittlement of interconnect lines 30. This embrittlement has also been shown to lead to an increased incidence of stress-induced voiding. The present invention minimizes the incidence of stress-induced voiding by reducing the amount of free H radicals inherently present in silane plasma. This is accomplished by reducing the silane flow rate during ILD formation. This has been shown to be particularly effective in reducing embrittlement in Al containing interconnect lines. This leads to a much lower incidence of stress-induced voiding in the interconnects, thereby producing better quality interconnects.

Referring to FIGS. 5, 6, and 8, the present invention also uses a standard PECVD tool (such as a P5000 available from Applied Materials, Inc.). As in FIG. 6, a typical PECVD chamber 610 is in readiness for SiON layer 21 deposition. As shown in Step A of FIG. 8, a wafer 10A is placed on a susceptor 601 in a PECVD chamber 610. In Step B, a vacuum between about $10^{-6}$ to $10^{-9}$ Torr is created inside the chamber 610. In Step C the temperature of the susceptor 601 is adjusted to regulate the process temperature Acceptable process temperatures used in the practice of the present invention range from about 350° C. to about 450° C., preferably about 350° C.

The prior art used gas flow rates of about 2000 SCCM for nitrogen, in the range of 60–75 SCCM for silane, and in the range of 60–75 SCCM for $N_2O$. The present invention uses reduced silane flow rates.

In Step D of the present invention, gases 603, 604, and 605 are dispensed into the chamber 610 at regulated flow rates. The nitrogen flow rate is in the range of 1700–2300 SCCM, but the silane flow rate is reduced to a level below 60 SCCM. The silane/$N_2O$ ratio is maintained at approximately 1:1. A preferred silane flow rate is about 35 SCCM. The $N_2O$ flow rate is similarly reduced. In this embodiment the silane flow rate 605 is critical and must be carefully regulated below 60 SCCM.

In Step E, before the gases contact the wafer 10A they are subject to an RF AC power source 606 of about 285–330 W.

The power source is a standard 13.56 or 30 MHz power source. Introduction of this RF electromagnetic energy into the reaction gases 603, 604, and 605, ignites a plasma 608 in a region above the wafer 10A where it forms a plasma cloud 608. SiON forms in the plasma cloud 608.

Referring to FIG. 7 and Step F of FIG. 8, once the plasma cloud 608 is formed, the PECVD deposition parameters are adjusted to insure the SiON layer 21 maintains consistent optical properties. Typically, this is accomplished by adjusting deposition parameters such as process temperature or process pressure. The details of such adjustments are disclosed above. In Step G, the susceptor 601 is elevated, raising the wafer 10A into the plasma cloud 608 to a distance D of approximately 425 mils from the electrode 607 where SiON deposition begins. The actual distance D may be varied according to the dictates of the process engineer. Deposition continues until a SiON layer 21 is formed of an appropriate thickness, approximately 250 Å to 3000 Å, preferably 2000 Å. Deposition times are approximately 30–80 seconds. Deposition pressures are in the range of about 2.5 Torr to about 6.0 Torr. As a result of the reduced silane flow rate 605, less embrittlement occurs in the interconnect lines 30 during SiON deposition since less free H is produced during deposition. This results in a greatly reduced incidence of stress-induced voiding in the interconnect line 30. Interconnect materials particularly benefitting from the instant process are process materials containing copper or aluminum. However, all materials that are subject to embrittlement in the presence of silane plasma benefit from the process.

In Step H the wafer 10A is removed from chamber 610. In Step I, as discussed hereinabove, the SiON layer 21 is checked to insure consistent optical properties falling within an acceptable range. In Step J, after an acceptable SiON layer 21 has been formed, a relatively thick layer of $SiO_2$ 22 is formed over the SiON layer 21 to complete the improved ILD formation process. As disclosed hereinabove, the actual thickness is dependent on subsequent process integration. The wafer 10A is now ready for further processing as shown in Step K.

IMPROVED METHOD OF ILD FORMATION USING PRE-ILD DEPOSITION ANNEAL OF INTERCONNECT LINES

The quality of ILD's and interconnect lines is improved when an alternative process flow has been used. In ordinary processing, the metallization layers are formed on a substrate, subject to lithographic pattern-masking and etching to form patterns of electrical interconnect lines (or stacks) which are then covered with an ILD (these steps may undergo repeated iterations to form vertically stacked layers). After an entire structure is completed, all the interconnect lines are annealed at one time.

Annealing has been shown to have a significant effect on stress-induced voiding. Annealing is a heating process used to cause various materials of a semiconductor chip to undergo chemical reactions. In particular, Ti layers and Al layers which are adjacent to each other and share a common interface undergo a reaction to form $TiAl_3$. This is accompanied by a volume contraction in the newly formed $TiAl_3$ layer, and is characteristic of the $TiAl_3$ reaction. The volume contraction in the $TiAl_3$ layer subjects the interconnect to stress. This may lead to excessive stress in the interconnect lines 30 which leads to stress-induced voiding.

The present invention teaches a solution to this problem. By annealing the substrate before ILD formation, a significant reduction in the incidence of interconnect line voiding is achieved as compared to interconnects which are annealed after the formation of an ILD layer. This effect is so pronounced that it has been discovered that by annealing prior to ILD formation the mean time to failure (MTTF) of microcircuits is increased by as much as eleven times.

Figure 9:
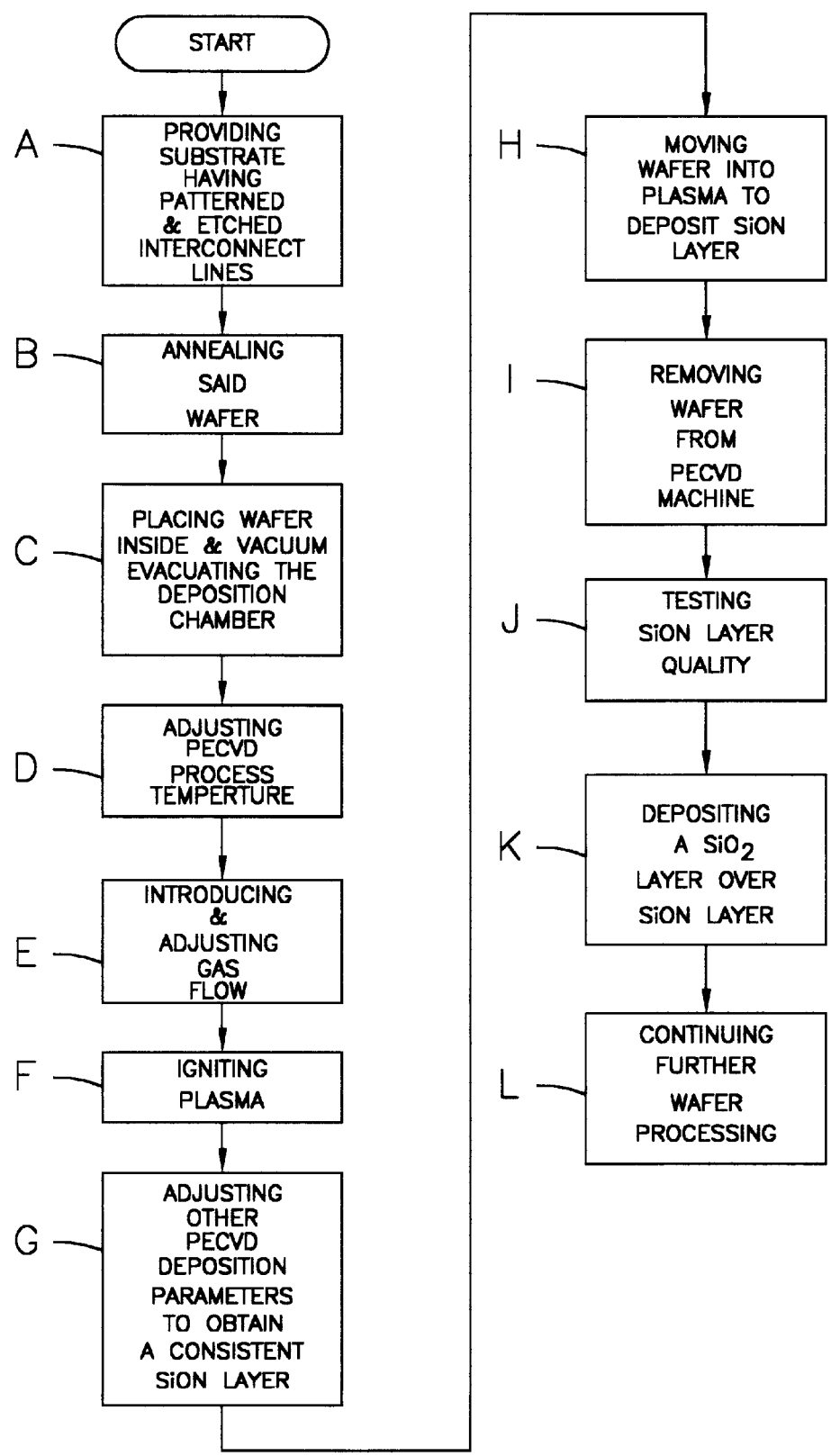
Figure 10A:
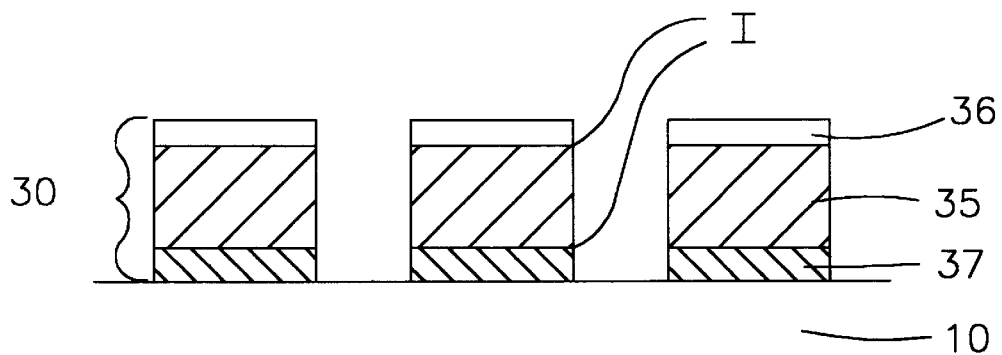
FIGS. 10A and 10B are cross-section views of a metallization stack with a capping layer and underlayer.
Figure 10B:
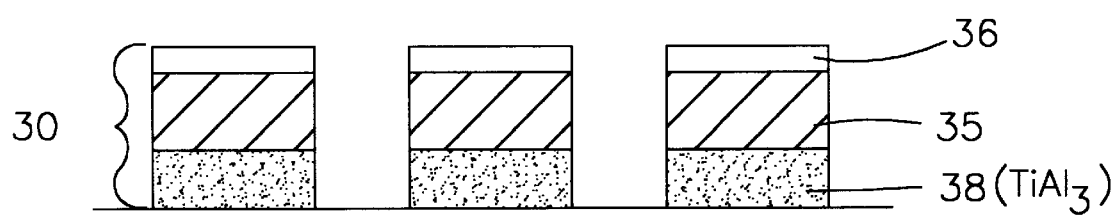

Referring to FIGS. 9, 10A, and 10B, in Step A, a substrate 10 is provided which has interconnect lines 30 already etched and formed in predetermined patterns. In Step B, the interconnect lines 30 are annealed. As illustrated in FIG. 10A, this process is particularly advantageous in interconnect lines 30 where at least one titanium (Ti) containing layer 36, 37 shares a common interface I with at least one Al containing layer 35. This is especially significant when an Al conducting layer 35 has a Ti underlayer 37. In such cases, annealing reacts the Al with the Ti to form a $TiAl_3$ intermetallic 38, as shown in FIG. 10B. Formation of the $TiAl_3$ compound 38 is associated with a volume change which creates additional hydrostatic tension in the interconnect lines 30. By annealing prior to ILD formation, the interconnect line 30 has an opportunity to relieve stress by undergoing plastic deformation. Such interconnect line deformation would otherwise be constrained by the presence of a previously deposited ILD layer 20 as in FIGS. 1 and 2. It should be noted that the underlayer 37 and capping layer 36 need not be comprised of a single material. In fact, such layers 36,37 are frequently multi-layer structures formed of a variety of different materials. For example, the interconnect may comprise an underlayer 37 comprising a TiN layer adjacent to the substrate 10 with a layer of Ti formed over the TiN layer, with a next layer 35 comprised of Al with 0.5% copper (Cu), topped with a capping layer 36 comprised of a TiN/Ti antireflective coating. By annealing first, then subsequently depositing an ILD, the incidence of stress-induced voiding is significantly reduced in interconnect lines. Annealing is typically accomplished by rapid thermal anneal (RTA) or furnace anneal techniques. For example, RTA may be performed using a rapid thermal processing system such as those manufactured by AG Associates or Applied Materials. An exemplar process would be to anneal the substrate, after etching, in a RTA process at a temperature of about 400° C. for about 2–10 minutes. Alternatively, furnace annealing at 400° C. for about an hour will effectively anneal the substrate.

After annealing, the ILD is formed using a standard PECVD tool (for example, an Applied Materials P5000). Referring to FIGS. 5, 6, and 9, the present invention applies an ILD comprised of a SiON layer 21 and a thick $SiO_2$ layer 22 both applied after annealing. FIG. 6 depicts a PECVD chamber 610 in preparation for deposition of the SiON layer 21. Once annealed, in Step C, a wafer 10A is placed on a susceptor 601 of the PECVD chamber 610 and a vacuum of between $10^{-6}$ to $10^{-9}$ Torr is created inside the chamber 610. In Step D the temperature of the susceptor 601 is adjusted to regulate the process temperature. Acceptable process temperatures range from about 350° C. to about 450° C., preferably 350° C. As disclosed hereinabove process temperatures below about 380° C. significantly decrease the incidence of voiding and are therefore preferred.

In Step E, $N_2$, $N_2O$, and $SiH_4$ gases 603, 604, and 605, respectively, are introduced by regulated flow into the chamber 610. A wide variety of gas flow rates (for example, about 2000 SCCM for $N_2$, about 70 SCCM for $N_2O$, and about 70 SCCM for $SiH_4$) result in acceptable layers. However, as discussed hereinabove $SiH_4$ flow rates of less than about 60 SCCM result in significantly fewer incidences of stress-induced voiding in the interconnects, with a preferred $SiH_4$ flow rate of about 35 SCCM. Additionally the SiH$_4$/N$_2$O flow rate ratio is preferably at approximately 1:1. In Step F, before the gases 603, 604, and 605 contact the wafer 10A they are subject to an RF AC power source 606. The power source is a standard 13.56 or 30 MHz power source at between about 285–330 W. The power source 606 introduces RF electromagnetic energy into the reaction gases 603, 604, and 605, igniting a plasma. This energized plasma is formed above the wafer 10A and the susceptor 601 where it forms a plasma cloud 608. SiON forms in the plasma cloud 608.

Referring to FIG. 7 and Step G of FIG. 9, once the plasma cloud 608 is formed, the PECVD deposition parameters are adjusted to insure the SiON layer 21 maintains consistent optical properties. Typically, this is accomplished by adjusting deposition parameters such as process temperature or process pressure. Such adjustments are similar to those disclosed above. In Step H, the susceptor 601 is elevated, raising the wafer 10A into the plasma cloud 608 to a distance D of approximately 425 mils from the electrode 607 where SiON deposition begins. Distance D may be altered to accommodate the specific dictates of a process engineer. Deposition continues until a SiON layer 21 is formed to an appropriate thickness, approximately 250 Å to 3000 Å, preferably 2000 Å. Approximate deposition times range between 30–80 seconds. The deposition pressure is maintained at approximately 2.5–6.0 Torr. In Step I the wafer 10A is removed from chamber 610 and subjected to post deposition testing (Step J) to determine SiON layer optical consistency as disclosed hereinabove. In Step K, after a reliable SiON layer 21 has been formed a layer of SiO$_2$ 22 is formed over the SiON layer 21 to complete the ILD formation process. A typical thickness range for such SiO$_2$ layers is between about 0.5 $\mu$m to about 1.5 $\mu$m. The precise thickness being determined by the process engineer. The wafer 10A is now ready for further processing, Step L.

IMPROVED METHOD OF ILD FORMATION USING INTEGRATED PROCESS FLOWS INCORPORATING SEVERAL PROCESS IMPROVEMENTS

Finally, each of the abovementioned process improvements may be combined to form high quality ILD's with reduced incidence of stress-induced voiding in the underlying interconnect lines. Annealing may be conducted prior to ILD deposition in order to react the Ti and Al layers into TiAl$_3$, thereby reducing the incidence of stress-induced voiding. Additionally, SiON deposition may be conducted at a lower temperature with a reduced silane flow. When the low temperature, low silane flow, and pre-ILD annealing process flows are combined, care must be taken to insure a SiON layer 21 of consistent, optical characteristics is formed. Adjustments to deposition pressure and energizing power maintain constant optical properties (i.e., refractive index in the range of 1.63–1.71) in the SiON layer. By combining all three process improvements, the overall stress state of the interconnect lines is significantly reduced. The reduction of SiON deposition temperature provides less driving force for void formation in the interconnects during ILD formation. The reduction of silane flow rate reduces the number of H radicals produced and decreases the embrittlement of interconnect lines. Finally, annealing Ti with Al to form TiAl$_3$ prior to ILD deposition allows the Al to deform prior to being constrained by a subsequently fabricated ILD layer. Each of these effects reduces the overall incidence of stress-induced voiding and thereby increases overall microcircuit reliability.

An exemplar process encompasses metallization, lithographically patterning the metal, etching to form a specific pattern of interconnect lines, annealing the interconnect lines in an RTA process at about 400° C. for about 2–10 minutes. Then the SiON layer is formed using a PECVD process temperature in the range of about 330–380° C., with gas flows of about 2000 SCCM for N$_2$, less than 60 SCCM for SiH$_2$, SiH$_4$ being in an approximate 1:1 ratio with N$_2$O. The pressure being adjusted in the range of about 2.5–6.0 Torr with RF power being likewise adjusted between about 285–330 W to achieve an SiON layer having consistent and acceptable optical properties. Once the SiON layer is formed and has satisfactory optical properties, a SiO$_2$ layer is formed over the SiON layer completing the ILD. The wafer 10A is now ready for further processing.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims. In particular, the method has direct applicability to any interconnect layer which has a coefficient of thermal expansion differing from that of the underlying substrate material or the associated ILD material. Also, the invention applies to interconnect materials which are susceptible to embrittlement caused by H radicals or the presence of silane plasma. Furthermore, it should be noted that these effects are directly applicable to Al alloys, such as Al/Cu alloys, which are coming into common usage, especially when such materials have Ti containing capping layers and underlayers. It is also noted that the inventions illustratively disclosed herein may be practiced without any element which is not specifically disclosed herein.

We claim:

1. A submicron semiconductor technology process for minimizing thermal stress-induced voids in electrical interconnect line structures, said process comprising the steps of:

a) providing at least one semiconductor substrate having a plurality of transistor gate structures, each transistor gate structure of said plurality of transistor gate structures having a width less than or equal to 0.25 $\mu$m, and also having at least one pattern of electrical interconnect line structure formed thereon with a line spacing less than 0.35 $\mu$m;

b) preventing said electrical interconnect line structure from experiencing yield stress, due to restricted plastic deformation, and hydrogen embrittlement, and thereby minimizing thermal stress-induced voids in said electrical interconnect line structure by annealing said at least one semiconductor substrate for plastically deforming said electrical interconnect line structure, and then setting PECVD deposition parameters comprising a deposition temperature in a range of 350° C. to 450° C. and further setting a chamber pressure in a range of 2.5 Torr to 6.0 Torr, a plurality of gas flow rates for producing a plasma, and a plasma-energizing power setting in a range of 285 W to 330 W for producing a stoichiometric silicon oxynitride layer having a refractive index in a target range of 1.63 to 1.71, and then depositing a stoichiometric silicon oxynitride layer between and on top of said electrical interconnect line structure using PECVD techniques, wherein said depositing step includes forming said plasma comprising nitrogen, nitrous oxide, and silane gases being dispensed at said set flow rates and being energized at said set plasma-energizing power setting by a radio frequency power source, wherein said nitrogen gas flow rate is set at approximately 2000 standard cubic centimeters per minute, wherein said silane gas flow rate is set less than 75 standard cubic centimeters per minute, wherein said gas flow rates facilitate producing said stoichiometric silicon oxynitride layer having said refractive index in said range of 1.63 to 1.71;

c) testing said stoichiometric silicon oxynitride layer and determining that its refractive index is in said refractive index target range of 1.63 to 1.71;

d) repeating said steps a) through c) if said target range is not met; and e) depositing a layer of silicon dioxide on top of said stoichiometric silicon oxynitride layer, only if said target range is met.

2. The process of claim 1, wherein said annealing step is performed using a rapid thermal annealing process (RTA).

3. The process of claim 2, wherein said rapid thermal annealing step is performed at about 400° C. for a time between about two minutes and about ten minutes.

4. The process of claim 1, wherein said annealing step is performed using a furnace annealing process.

5. The process of claim 4, wherein said furnace annealing step is performed at about 400° C. for about 60 minutes.

6. The process of claim 1, wherein said step b), said silane gas flow rate is set less than 60 standard cubic centimeters per minute, and wherein said step b), a ratio of said silane gas flow rate to said nitrous oxide gas flow rate is maintained at approximately 1:1.

7. The process of claim 1, wherein said step b), said silane gas flow rate is set at approximately 35 standard cubic centimeters per minute, and wherein said step b), said ratio of silane gas flow rate to nitrous oxide gas flow rate is maintained at approximately 1:1.

8. The process of claim 1, wherein said electrical interconnect line structures are comprised of one or more layers of different conducting materials.

9. The process of claim 8, wherein at least one of said one or more layers of different materials is comprised of an aluminum containing material.

10. The process as in claim 8, wherein said electrical interconnect line structures includes:

a) at least one layer comprised of titanium containing material; and b) at least one layer comprised of aluminum containing material, said titanium containing layer and said aluminum containing layer sharing an interface, and said annealing step continues until said titanium containing layer reacts with said aluminum containing layer to form a $TiAl_3$ intermetallic.

11. The process as in claim 10, wherein said at least one layer comprised of titanium containing material is an underlayer, wherein said underlayer has the aluminum containing layer formed thereon, and wherein said annealing step continues until the titanium of said underlayer reacts with the aluminum of the aluminum containing layer to form a $TiAl_3$ intermetallic.

* * * * *